United States Patent [19]
Adachi et al.

[11] Patent Number: 5,446,309
[45] Date of Patent: Aug. 29, 1995

[54] SEMICONDUCTOR DEVICE INCLUDING A FIRST CHIP HAVING AN ACTIVE ELEMENT AND A SECOND CHIP HAVING A PASSIVE ELEMENT

[75] Inventors: Chinatsu Adachi, Minou; Masaaki Nishijima, Moriguchi; Yorito Ota, Kobe; Osamu Ishikawa, Kyoto, all of Japan

[73] Assignee: Matsushita Electric Industrial Co., Ltd., Kadoma, Japan

[21] Appl. No.: 69,016

[22] Filed: May 28, 1993

[30] Foreign Application Priority Data

Jun. 22, 1992 [JP] Japan .................. 4-162480

[51] Int. Cl.⁶ .............................................. H01L 25/00
[52] U.S. Cl. .................... 257/528; 257/531; 257/777
[58] Field of Search .............. 257/777, 528, 531, 532, 257/533, 621

[56] References Cited

U.S. PATENT DOCUMENTS

| | | | |
|---|---|---|---|
| 4,697,095 | 9/1987 | Fujii | 257/777 |
| 4,890,077 | 12/1989 | Sun | 257/280 |
| 5,008,736 | 4/1991 | Davies et al. | 257/777 |

FOREIGN PATENT DOCUMENTS

| | | |
|---|---|---|
| 46-023212 | 7/1971 | Japan . |
| 60-41249 | 3/1985 | Japan . |
| 1-228202 | 9/1989 | Japan . |
| 2-62069 | 3/1990 | Japan . |
| 3-222492 | 10/1991 | Japan . |

OTHER PUBLICATIONS

Minoru Takaya and Akihiko Fujisawa, "The Development of Composite Multilayer Hybrid Components", IEEE Tokyo Section, Denshi Tokyo No. 30, at pp. 62–66 (1991).

*Primary Examiner*—William Mintel
*Assistant Examiner*—Roy Potter
*Attorney, Agent, or Firm*—Ratner & Prestia

[57] ABSTRACT

A semiconductor device includes a first chip and a second chip. Active elements such as transistors are fabricated on the surface of the semiconductor substrate of the first chip. Passive elements such as inductors and capacitors are fabricated on the second chip. The first chip is so disposed on the second chip that the reverse surface of the first chip makes a contact onto the surface of the second chip. The active element and the passive element are electrically connected by bonding wire.

6 Claims, 3 Drawing Sheets

SEMICONDUCTOR DEVICE INCLUDING A FIRST CHIP HAVING AN ACTIVE ELEMENT AND A SECOND CHIP HAVING A PASSIVE ELEMENT

BACKGROUND OF THE INVENTION

The present invention relates to a semiconductor device comprised of active elements such as transistors and diodes, and passive elements such as inductors and capacitors, which may be incorporated extensively in various portable telephones, wireless communication equipments, and other types of electronic equipment.

Various hybrid integrated circuits (HICs) comprised of active element chips such as transistor chips and passive element chips such as inductors and capacitors mounted on common printed circuit boards are presently incorporated extensively in modern types of electronic equipment.

However, since a number of functional chips have to be assembled on a common circuit board in order to fabricate a HIC, the high-density mounting of these chips occupying a relatively large area on the circuit board requires a relatively difficult process. This limits the miniaturization of HIC.

Moreover, since a plural number of functional chips have to be mounted on the circuit board one-by-one by either the die-bonding or the wire-bonding process, a number of bonding steps have to be provided in the HIC manufacturing process.

On the other hand, in addition to the above-mentioned HIC, the demand for micro-wave monolithic integrated circuits (MMICs) in which active elements such as transistors, passive elements such as the inductors, and the micro-strip line connecting these two types of the elements are formed together on a semiconductor substrate, is now dramatically increasing.

However, since the various active elements and the various passive elements having totally different functions have to be formed simultaneously on the semiconductor substrate in the manufacturing process of MMIC, simultaneous satisfactions of the individually desired characteristics of these elements are highly difficult to attain.

Furthermore, since a total failure of MMIC could be produced by a single failure of any of the incorporated active elements or passive elements, the attainment of high production yield of MMIC is a difficult task.

SUMMARY OF THE INVENTION

A semiconductor device in accordance with the present invention comprises at least one first chip of a semiconductor substrate on one side of which at least one active element is fabricated, and a second chip of another semiconductor substrate having at least one passive element. The first chip is so mounted on the second chip that the other side of the first chip is in contact with the surface of the second chip, and at least the active element of the first chip is electrically connected with the passive element of the second chip by means of bonding wire.

The above-mentioned active element can be a transistor such as a field-effect transistor (FET) or a bipolar transistor, or a diode, while the passive element can be an inductor, a capacitor or a resistor.

The number of the first chips to be mounted on the second chip is not limited to only one. A plural number of the first chips may be mounted if necessary.

The semiconductor device in accordance with the present invention can be manufactured by assembling at least one first chip having at least one active element and a second chip having at least one passive element. These chips can be individually manufactured and inspected before the assembly process.

It is difficult to manufacture the active element and the passive element (each having different functions) at a simultaneously and high production yield, as in case of the MMIC production. But it is relatively easy to obtain a relatively high yield if those elements are manufactured individually. Therefore, a semiconductor device in accordance with the present invention can be manufactured at a relatively higher yield.

In addition, since one raw chip is mounted on the other raw chip, the semiconductor device in accordance with the present invention has a surface area far less than that of a conventional HIC. Furthermore, since bonding points between the chips performed by die bonding or wire bonding are reduced, the semiconductor device can be assembled in a reduced number of steps.

Furthermore, since the reverse surface of the first chip is in contact with the surface of the second chip, the heat generated in the first chip is transmitted to the second chip. The heat is then dissipated from the reverse surface of the second chip. Thus, improved thermal dissipation characteristics can be realized.

BRIEF DESCRIPTION OF THE DRAWINGS

FIGS. 1(a) and 1(b) show plan view and a sectional view along the line 1B—1B shown in the drawings, respectively.

FIGS. 2(a) and 2(b) show a plan view and a sectional view along the line 2B—2B shown in the drawings, respectively.

FIGS. 3(a) and 3(b) show a plan view and its sectional view along the line 3B—3B shown in the drawings, respectively.

DESCRIPTION OF THE PREFERRED EMBODIMENTS

EMBODIMENT-1

Figure 1A:
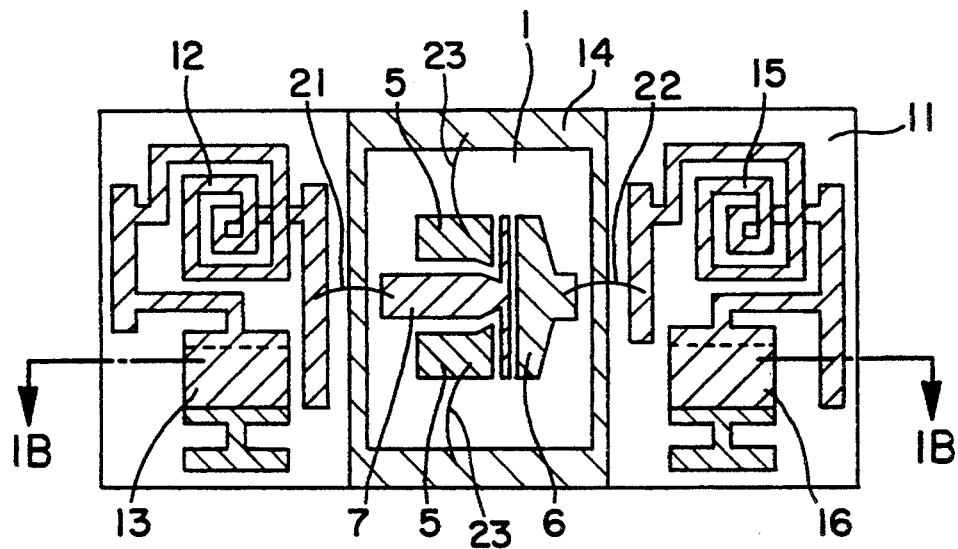
FIGS. 1(a) and 1(b) illustrates a schematic structure of a semiconductor device in accordance with Embodiment-1 of the present invention.
Figure 1B:
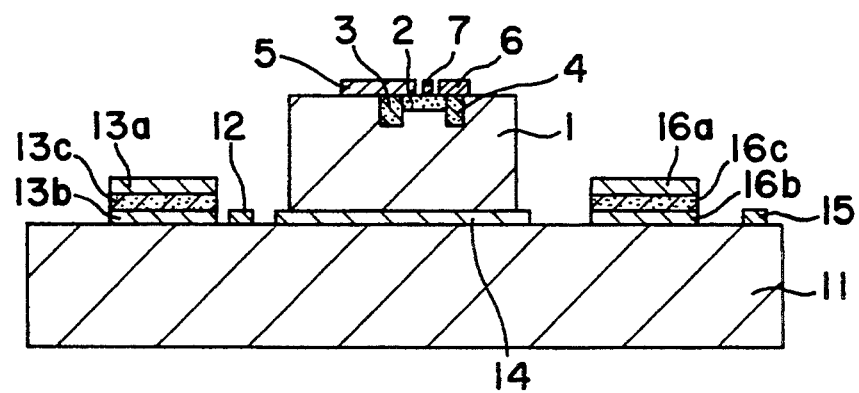

FIGS. 1(a) and 1(b) illustrates a schematic structure of a semiconductor device in accordance with the present invention in which a first chip having a FET is mounted on a second chip having an inductor and a capacitor. In FIGS. 1(a) and 1(b), the numeral 1 is a semi-insulating GaAs substrate of the first chip on which a channel 2, a source region 3 and a drain region 4 of the FET are formed by respective diffusion processes.

A gate electrode 7 comprised of aluminium is formed on the channel 2, and a source electrode 5 and a drain electrode of AuGe are formed on the respective surfaces of the source region 3 and the drain region 4.

The numeral 11 is a semi-insulating GaAs substrate of the second chip on which an input matching circuit made of an inductor 12 and a capacitor 13, an output matching circuit made of an inductor 15 and a capacitor 16, and a grounding electrode 14 of Au are formed.

The inductors 12 and 15 include a gold conductor formed in spiral formed patterns. The capacitors 13 and 16 are of a metal-insulator-metal (MIM) structure, and include the upper gold layers 13a and 16a, the lower gold layers 13b and 16b, and the silicon nitride insulating layers 13c and 16c which are individually sandwiched between the respective upper and lower gold layers.

The reverse surface of the first chip is fixed by means of die-bonding onto the grounding electrode 14, and the gate electrode 7 and the input matching circuit, the drain electrode 6 and the output matching circuit, and the source electrode 5 and the grounding electrode 14 are respectively wire-bonded together through the gold wires 21, 22, and 23.

By constructing a semiconductor device as set forth above, a semiconductor device having a smaller surface area than that of HIC can be obtained, and the number of assembling steps can be reduced. Furtheremore, the production yield is increased, compared with MMIC, and a heat dissipation capability is realized.

Although first embodiment 1 has been described as including a chip fixed on the grounding electrode 14, the fixation of the first chip on the grounding electrode 14 is not necessarily required.

Instead, the grounding electrode 14 may be provided on the GaAs substrate 11 at another place, such as neighboring to the first chip, and the first chip may be fixed directly on the GaAs substrate 11 of the second chip.

EMBODIMENT-2

Figure 2A:
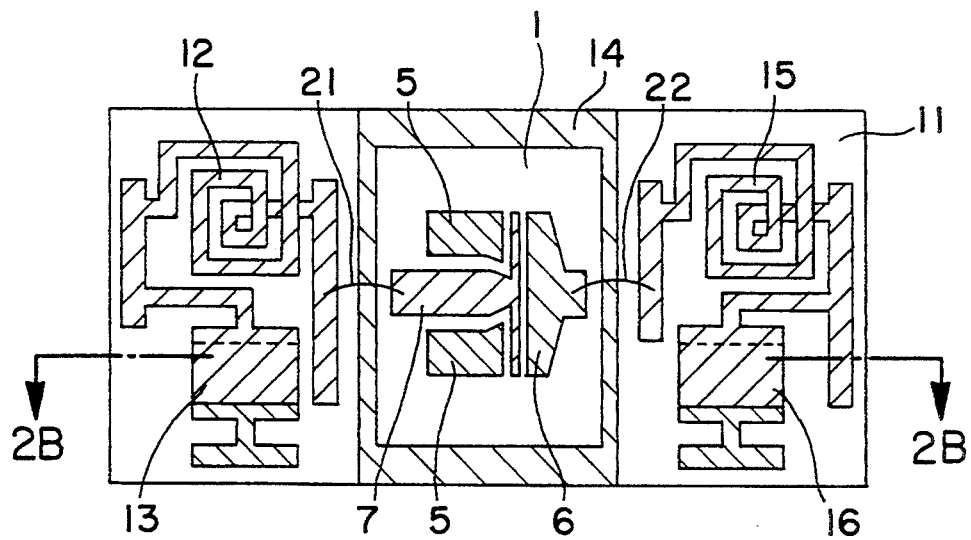
FIGS. 2(a) and 2(b) illustrates a schematic structure of a semiconductor device in accordance with Embodiment-2 of the present invention.
Figure 2B:
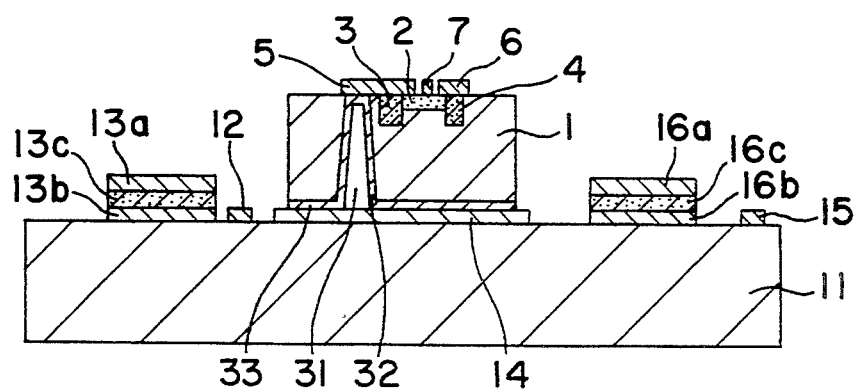

Embodiment-2 shown in FIG. 2 is another semiconductor device in accordance with an exemplary embodiment of the present invention which in some ways is similar to Embodiment-1.

In FIG. 2, instead of the gold wire 23 shown in FIG. 1, the source electrode 5 and the grounding electrode 14 are connected by means of a via-hole conductor. In FIG. 2, the numberal 31 is a via-hole (through-hole) formed by an etching method under the source electrode 5 on the GaAs substrate 1 of the first chip.

The via-hole conductor 32 and the reverse surface electrode 33 of Au are simultaneously deposited on the internal surface of the via-hole 31 and the reverse surface of the GaAs substrate 1. The reverse surface electrode 33 is fixed onto the grounding electrode 14, and the source electrode 5 and the grounding electrode 14 are electrically connected through the via-hole conductor 32.

As a result of the construction set forth above, some of the advantages which are realized by the Embodiment-1 can be realized. Furthermore, the gain loss caused by the serial inductance which could be produced by the gold wire extended from the source electrode 5 can be avoided at a high frequency region like several gigahertz In this manner, improved high-frequency characteristics of the device can be obtained.

EMBODIMENT-3

Figure 3A:
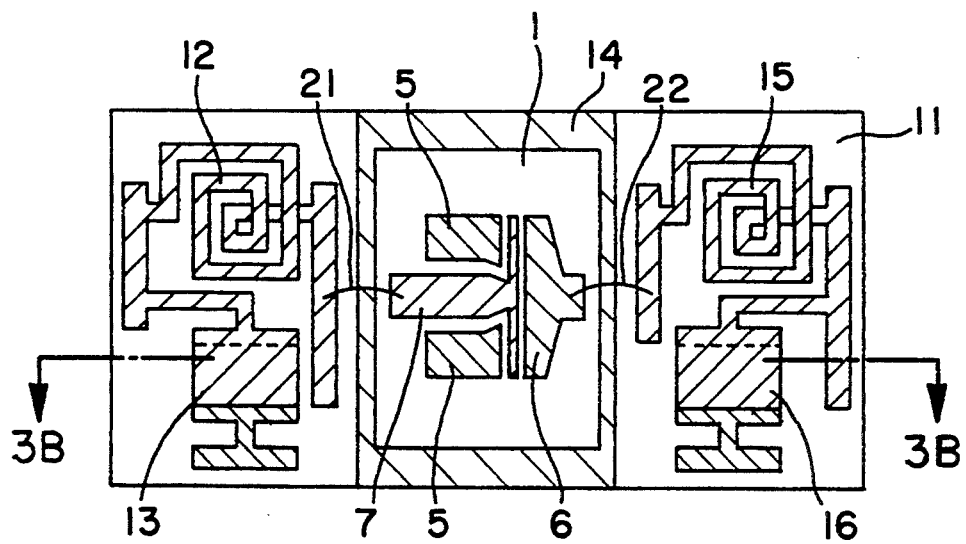
FIGS. 3(a) and 3(b) illustrates a schematic structure of a semiconductor device in accordance with Embodiment-3 of the present invention.
Figure 3B:
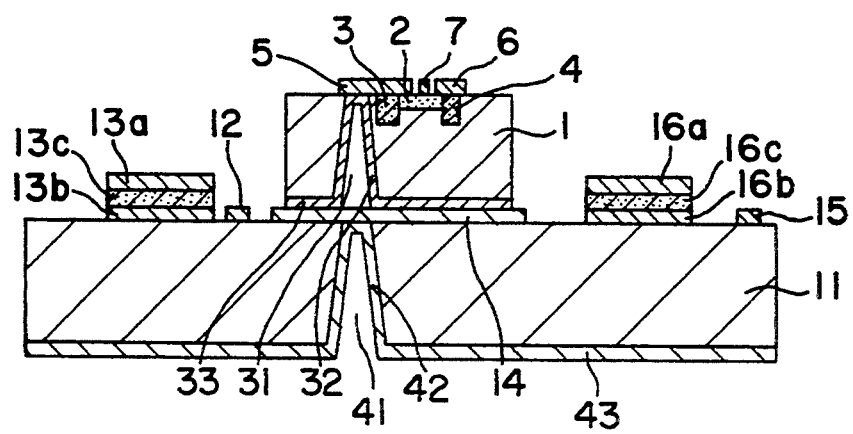

Embodiment-3 shown in FIG. 3 is another semiconductor device in accordance with an exemplary embodiment of the present invention which in some ways is similar to Embodiment-2. FIG. 3 shows a via-hole 41, a via-hole conductor 42 and a reverse surface electrode 43 formed also on the GaAs substrate 11 of the second chip.

The via-hole 41 is formed under the grounding electrode 14 by an etching method, and the via-hole conductor 42 and the reverse surface electrode 43 are simultaneously formed by depositing gold, so that the source electrode 5, grounding electrode 14, and the reverse surface electrode 43 are electrically connected automatically through the via-hole conductors 32 and 42.

As a result of the construction set forth above, the reverse surface electrode 43 can be directly contacted onto the grounding terminal of an external circuit when the semiconductor device of the invention has to be connected to the external circuit.

Therefore, the grounding electrode 14 and the grounding terminal of the external circuit can be connected together through the via-hole conductor 42 without using a bonding wire bridging between them two. Therefore, the gain loss otherwise caused by the serial inductance of the gold wire can be avoided, which in turn results in a desire with improved high-frequency characteristics.

In accordance with exemplary embodiments of the present invention, many more modifications than the ones described above may exist. For instance, although only one of the first chips is mounted on the second chip in the embodiments described above, mounting of two or more of the first chips is also possible.

The active element fabricated in the first chip is not necessarily a FET. The active element could be a bipolar transistor or a diode, and the number of active elements incorporated in the first chip can be two or more instead of only one.

The passive element in the second chip is not necessarily a combination of an inductor and a capacitor. The passive element could be any combination of inductors, capacitors, resisters, and combinations thereof.

In addition, the passive elements need not necessarily be within the obverse surface of the semiconductor substrate. The passive elements can be fabricated on the reverse surface and in the inside of the semiconductor substrate.

The material of the semiconductor substrate is not limited to GaAs, but it could be a semiconductor compound such as InP, semiconductor element Si, or a composite material such as a GaAs layer deposited on a Si substrate.

Likewise, the other specified components are not limited to the compositions set forth above. For instance, a bonding wire made of aluminum, instead of the gold bonding wire, may be used.

As above described, the present invention is not limited within the scope of the above shown embodiments of the invention, and modifications within the true spirit and scope of the invention are included in the scope of the claims of the present invention.

What is claimed:

1. A semiconductor device comprising:
 a first chip having a first semiconductor substrate including a first surface and an opposite second surface, at least one active element without passive elements fabricated on said first surface,
 a second chip having a second semiconductor substrate including a third surface which has at least one passive element without active elements, and
 wherein the first chip is mounted on a grounding electrode formed on the third surface of the second semiconductor substrate so that the second surface of the first semiconductor substrate makes direct contact to the grounding electrode, and the active element of the first chip is coupled to a reverse surface electrode, which is electrically connected to the grounding electrode, through a via-hole conductor provided in the semiconductor substrate of the first chip, and at least the active element of the first chip is electrically connected by a bonding conductor to the passive element of the second chip.

2. A semiconductor device according to claim 1, wherein the grounding electrode and a second reverse surface electrode formed on a reverse surface of the semiconductor substrate of the second chip are electrically connected through a via-hole conductor provided in the semiconductor substrate of the second chip.

3. A semiconductor device comprising:
at least one first chip having a first GaAs substrate including a first surface and an opposing second surface,
at least one transistor is fabricated on said first surface containing at least a source electrode,
a second chip having a second GaAs substrate including a third surface on which at least one inductor, at least one capacitor and at least one grounding electrode are formed,
said first chip being mounted on said second chip so that the second surface of said first GaAs substrate makes direct contact to the third surface of said second GaAs substrate,
said transistor being electrically connected by a bonding conductor to at least one of said inductor and said capacitor, and
said source electrode of said transistor being electrically connected to said grounding electrode of said second chip through a via-hole conductor provided in the GaAs substrate of said first chip.

4. A semiconductor device according to claim 3, wherein the grounding electrode formed on the surface of the second chip is electrically connected to a reverse surface electrode formed on a reverse surface of the second chip through a via-hole conductor, provided in the GaAs substrate of said second chip.

5. A semiconductor device comprising:
a first chip having a first semiconductor substrate including a first surface and an opposite second surface, at least one active element without passive elements fabricated on said first surface,
a second chip having a second semiconductor substrate including a third surface which has at least one passive element without active elements,
and a grounding electrode is formed on the third surface of the second semiconductor substrate, and
wherein the first chip is mounted on the second chip so that the second surface of the first semiconductor substrate makes direct contact to the third surface of the second semiconductor substrate,
and the active element of the first chip is coupled to a reverse surface electrode, which is electrically connected to the grounding electrode, through a via-hole conductor provided in the semiconductor substrate of the first chip,
and at least the active element of the first chip is electrically connected by a bonding conductor to the passive element of the second chip.

6. A semiconductor device according to claim 5, wherein the grounding electrode and a second reverse surface electrode formed on a reverse surface of the semiconductor substrate of the second chip are electrically connected through a via-hole conductor provided in the semiconductor substrate of the second chip.

* * * * *